(12) United States Patent
Sakaue et al.

(10) Patent No.: US 11,711,895 B2
(45) Date of Patent: Jul. 25, 2023

(54) WIRING BOARD PRODUCTION METHOD AND WIRING BOARD

(71) Applicant: JAPAN AVIATION ELECTRONICS INDUSTRY, LIMITED, Tokyo (JP)

(72) Inventors: Akitoshi Sakaue, Tokyo (JP); Kenji Matsumoto, Tokyo (JP)

(73) Assignee: JAPAN AVIATION ELECTRONICS INDUSTRY, LIMITED, Tokyo (JP)

(*) Notice: Subject to any disclaimer, the term of this patent is extended or adjusted under 35 U.S.C. 154(b) by 25 days.

(21) Appl. No.: 17/538,410

(22) Filed: Nov. 30, 2021

(65) Prior Publication Data

US 2022/0183159 A1 Jun. 9, 2022

(30) Foreign Application Priority Data

Dec. 9, 2020 (JP) ................................ 2020-204052

(51) Int. Cl.
*H05K 1/02* (2006.01)
*H05K 1/11* (2006.01)
(Continued)

(52) U.S. Cl.
CPC ............. *H05K 3/107* (2013.01); *H05K 1/092* (2013.01); *H05K 3/1216* (2013.01); *H05K 3/1283* (2013.01)

(58) Field of Classification Search
CPC ........ H05K 1/02; H05K 1/0224; H05K 1/025; H05K 1/0277; H05K 1/0287; H05K 1/092;
(Continued)

(56) References Cited

U.S. PATENT DOCUMENTS

| 6,879,096 B1* | 4/2005 | Miyazaki ................. H04N 5/70 313/422 |
| 2017/0199412 A1* | 7/2017 | Suto ......................... H05K 1/02 |

(Continued)

FOREIGN PATENT DOCUMENTS

| JP | 2012-256320 | 12/2012 |
| JP | 2019-075069 A | 5/2019 |
| TW | 201814465 | 4/2018 |

OTHER PUBLICATIONS

Office Action issued in Corresponding Taiwanese Patent Application No. 110144783, dated Aug. 11, 2022, along with an English translation thereof.

*Primary Examiner* — Xiaoliang Chen
(74) *Attorney, Agent, or Firm* — Greenblum & Bernstein, P.L.C.

(57) ABSTRACT

Provided is a wiring board including a fine-wire pattern made of cured conductive ink formed on a board surface, wherein assuming that two orthogonal directions on the board surface are directions X and Y, a line width of another fine wire that is included in the fine-wire pattern, passes through another point on the board surface not aligned in the direction X but aligned in the direction Y with one intersection where three or more fine wires included in the fine-wire pattern are centered at one spot, and does not form another intersection where three or more fine wires are centered at one spot at said another point is 1.5 times or more a minimum line width of the fine wires included in the fine-wire pattern.

16 Claims, 9 Drawing Sheets

(51) Int. Cl.

| | | |
|---|---|---|
| *H05K 1/14* | (2006.01) | |
| *H05K 1/16* | (2006.01) | |
| *H05K 3/12* | (2006.01) | |
| *H05K 3/18* | (2006.01) | |
| *H01L 21/8234* | (2006.01) | |
| *H01L 23/66* | (2006.01) | |
| *G06F 3/041* | (2006.01) | |
| *G06F 3/044* | (2006.01) | |
| *H05K 3/10* | (2006.01) | |
| *H05K 1/09* | (2006.01) | |

(58) Field of Classification Search
CPC ... H05K 1/11; H05K 1/14; H05K 1/16; H05K 1/165; H05K 1/181; H05K 3/12; H05K 3/18; H05K 3/108; H05K 3/1275; H05K 3/1216; H05K 3/1283; H05K 3/49894; H05K 3/5383; H01L 21/8234; H01L 23/66; H01L 24/08; H01L 23/573; G06F 3/041; G06F 3/044; G06F 3/0445; G06F 3/0446; G06F 3/04164
USPC .......................... 174/257; 313/292, 422, 495
See application file for complete search history.

(56) References Cited

U.S. PATENT DOCUMENTS

| | | | |
|---|---|---|---|
| 2017/0308192 A1* | 10/2017 | Ogura | G06F 3/04164 |
| 2018/0018042 A1* | 1/2018 | Shiojiri | G06F 3/0445 |
| 2020/0100355 A1* | 3/2020 | Choi | H05K 1/181 |
| 2020/0183537 A1* | 6/2020 | Sakaue | G06F 3/0445 |
| 2020/0326816 A1* | 10/2020 | Ogura | G06F 3/0446 |
| 2022/0201838 A1* | 6/2022 | Suzuki | H05K 3/18 |
| 2022/0246538 A1* | 8/2022 | Miyamoto | H01L 24/08 |

* cited by examiner

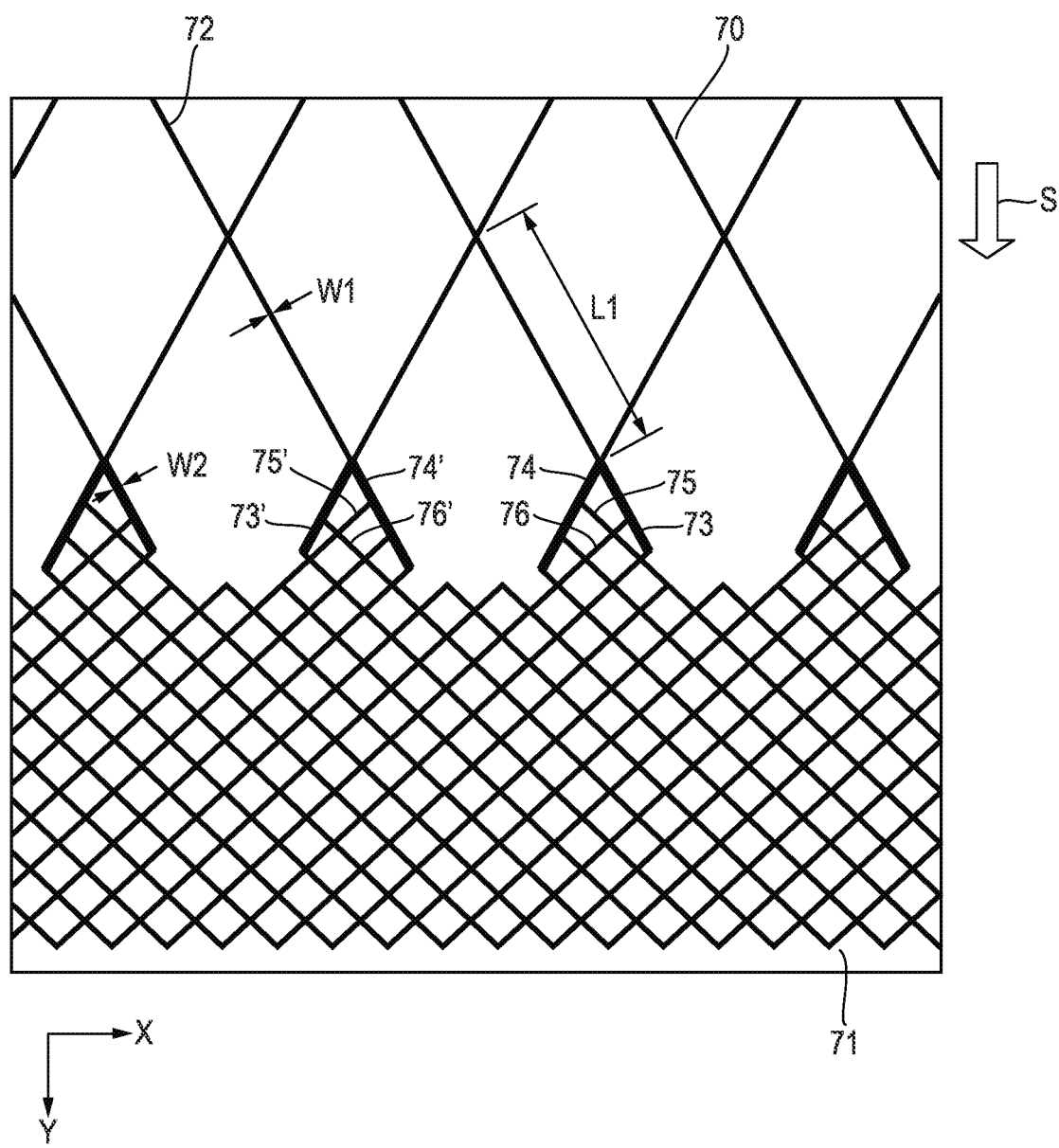

WIRING BOARD PRODUCTION METHOD AND WIRING BOARD

TECHNICAL FIELD

The present invention relates to a wiring board including a fine-wire pattern of cured conductive ink and a method of producing the wiring board.

BACKGROUND ART

FIGS. 1, 2A and 2B show the configuration of a capacitive touch panel described in Japanese Patent Application Laid Open No. 2019-75069 as an example of a wiring board including a fine-wire pattern of cured conductive ink. This touch panel has a configuration in which a first conductive layer, an insulating layer, a second conductive layer, and a protective film are laminated in this order on a transparent board 10. In FIG. 1, the portion surrounded by the rectangular frame is a sensor area 20 where sensor electrodes are located, and the detailed illustration of the sensor electrodes is omitted in FIG. 1.

Each sensor electrode consists of a first sensor electrode and a second sensor electrode. The first sensor electrode is composed of a first conductive layer, and the second sensor electrode is composed of a second conductive layer.

As shown in FIG. 2A, the first sensor electrode 30 has a configuration where a plurality of electrode rows 33 in which a plurality of island-like electrodes 31 aligned in a direction X parallel to the long side 21 of the sensor area 20 are connected through a connection part 32 are aligned in parallel in a direction Y parallel to the short side 22 of the sensor area 20.

As shown in FIG. 2B, the second sensor electrode 40 has a configuration where a plurality of electrode rows 43 in which a plurality of island-like electrodes 41 aligned in the direction Y are connected through a connection part 42 are aligned in parallel in the direction X.

The first sensor electrode 30 and the second sensor electrode 40 are each composed of a fine wire mesh, the electrode rows 33 and 43 are intersected with but insulated from each other, and the connection parts 32 and 42 are located to overlap each other.

A lead wire 51 is extended out from both ends of each electrode row 33 of the first sensor electrode 30 with respect to the direction X, and the lead wire 52 is extended out from one end of each electrode row 43 of the second sensor electrode 40 with respect to the direction Y. The plurality of arrays of lead wires 51 and 52 extended out from the sensor area 20, except for those located at both ends of the array, are not shown in FIG. 1.

Terminal portions 53 are aligned in the central portion of one long side of the rectangular transparent board 10, and the lead wires 51 and 52 extend to the terminal portion 53 and are connected to the terminal portion 53. A grounding wire 54 formed on the peripheral edge of the transparent board 10 so as to surround the sensor area 20 and the lead wires 51 and 52 is also connected to the terminal portion 53.

The lead wires 51 and 52 and the terminal portion 53 are composed of the first conductive layer, and the grounding wire 54 is composed of both the first and second conductive layers.

FIG. 3 is a diagram showing the details of a connection portion between the second sensor electrode 40 and the lead wire 52 described in Japanese Patent Application Laid Open No. 2019-75069, and a connection part 52a made of a fine mesh of fine wires lies at a tip of the lead wire 52.

Meanwhile, an extension portion 44 extends and resides on an end edge of the second sensor electrode 40. The extension portion 44 includes a large mesh portion 44a to which the mesh constituting the second sensor electrode 40 is extended, and a small mesh portion 44b further extended from the large mesh portion 44a. The small mesh portion 44b is a fine mesh of fine wires, and the small mesh portion 44b and the connection part 52a of the lead wire 52 have the same mesh structure in which each unit lattice cell is square.

In FIG. 3, 61 indicates a through hole formed in the insulating layer 60, and the connection part 52a of the lead wire 52 and the extension portion 44 of the second sensor electrode 40 are located in the through hole 61 and connected to each other so that electrical continuity is established therebetween. Consequently, the second sensor electrode 40 composed of the second conductive layer and the lead wire 52 composed of the first conductive layer are connected. In FIG. 3, the broken line indicates a dummy wire 35 that lies in the first conductive layer.

In this example, the first and second conductive layers having such a configuration are printed by gravure offset printing using a conductive ink containing conductive particles such as silver.

As described above, in the touch panels shown in FIGS. 1, 2A, 2B, and 3, the first and second conductive layers containing a fine-wire mesh pattern are printed by gravure offset printing using a conductive ink. However, it has been found that forming a fine-wire pattern by gravure printing or gravure offset printing in this way causes faint print on specific fine wires.

FIG. 4 is a photograph showing the faint print on the fine wires in a touch panel having basically the same layer structure and fine-wire pattern as the above-mentioned touch panel. This photograph shows a portion where the second sensor electrode composed of a mesh of fine wires is connected to a lead wire, and corresponds to a part of the drawing showing the connection portion shown in FIG. 3 described above. Although the unit lattice cell of the mesh of the second sensor electrode is a rhombus as in FIG. 3, in FIG. 4, the directions of the two long and short diagonal lines of each rhombus and the directions of the two long and short diagonal lines of a rhombus unit cell in FIG. 3 are off by 90°. In FIG. 4, the arrow S indicates the squeegeeing direction of the doctor blade observed when this fine-wire pattern is printed by gravure offset printing, and the alternate long and short dashed line indicates the extending direction of the doctor blade.

SUMMARY OF THE INVENTION

An object of the present invention is to provide a wiring board production method that prevents faint print shown in FIG. 4 from occurring on fine wires, thereby preventing an increase in resistance and breakage of fine wires due to faint print, and to provide a wiring board having excellent print quality without faint print.

The following technical matters are described with the objective of only making readers easily understand the outline of the present invention and not with the objective of limiting, explicitly or implicitly, the invention claimed in the claims or allowing a person other than the beneficiary of the present invention, the beneficiary being exemplified by the applicant and the right holder and others, to construe the following technical matters as limitations to the invention claimed in the claims. The outline of the present invention from other viewpoints can be understood from, for example, the claims at the time of filing of this patent application.

The present invention relates, in one aspect, to a method of producing a wiring board including a base and a wiring structure on the base. The wiring structure includes a conductive network formed of a conductor. The conductive network is made by printing and has a pattern suitable for, for example, a transducer of an electrostatic capacitive touch panel, which converts changes of electrostatic capacitance to an electrical signal. The pattern is hereinafter referred to as a "wiring pattern" in this section. The conductive network is positioned, directly or indirectly, on the base. More specifically, the conductive network may be positioned on the base, or on an insulation layer included in the wiring structure. The method includes gravure-printing the wiring pattern on the base or the insulation layer using a gravure plate on which a reticular groove having the same pattern as the wiring pattern is engraved, and a conductive ink that is a material for the conductor. The gravure-printing of the wiring pattern includes filling of the conductive ink into the reticular groove of the gravure plate and concomitantly removing excess conductive ink, using a doctor blade as a squeegee. Those processes are collectively called "squeegeeing" among those skilled in the art. The method is characterized by using, in the gravure-printing of the wiring pattern, a gravure plate as described next. The reticular groove of the gravure plate includes a number of groove segments, and at least one site P where N groove segments converge, in other words, meet or diverge. N is an integer satisfying N 3. Each of the groove segments preferably has a straight shape, but may have, for example, a curved shape, a bent shape or a meander shape. Any one of the groove segments, except both ends thereof, neither intersects with nor makes contact with the other groove segments. Readers may understand the site P by reference to a site indicated by a reference numeral a1 in FIG. 5A that shows a wiring pattern printed by a gravure plate, though FIG. 5A does not show the gravure plate itself. The site P is, in short, an intersection, or an at-grade junction, of N groove segments. A virtual line on the gravure plate, which extends in a direction orthogonal to a travel direction of the doctor blade on the gravure plate and passes through any of the one or more intersections P, intersects one or more groove segments, except both ends thereof, that are included in the reticular groove of the gravure plate. Readers may understand the virtual line by reference to a dashed-dotted line in FIG. 5A. At least one of the one or more groove segments which intersect with the virtual line has a width that is 1.5 times or more the minimum width of the groove segments included in the reticular groove. Each groove segment is preferably a thin, or fine, groove segment that has a width of several micrometers or several tens of micrometers.

The pattern of the reticular groove, which is coincident with the wiring pattern as described above, preferably includes a first pattern, a second pattern, and a transition pattern that is located between the first pattern and the second pattern and connects the first pattern and the second pattern. The transition pattern is formed of part of the reticular groove and this part includes preferably groove segments which extend from some but not all of the groove segments forming the first pattern, and groove segments which extend from some but not all of the groove segments forming the second pattern. The intersection P is included in this part of the reticular groove. In this regard, note that $D_2 > D_t > D_1$ is satisfied when "pattern density" is defined as "the area of the groove segments per unit area of the gravure plate", "the area of the groove segments" included herein is defined as "the total area of the bottoms of the groove segments as observed in a plan view of the gravure plate", the pattern density of the first pattern is $D_1$, the pattern density of the second pattern is $D_2$, and the pattern density of the transition pattern is $D_t$. The first pattern preferably has a mesh pattern. The mesh pattern of the first pattern has parallelogram apertures, preferably rhombus apertures. The second pattern preferably has a mesh pattern. The mesh pattern of the second pattern has parallelogram apertures, preferably rhombus apertures. The sizes, more specifically areas, of the apertures included in the first pattern are bigger than the sizes, more specifically areas, of the apertures included in the second pattern. The first pattern is a pattern for an electrode of the transducer, for example. The second pattern is a pattern for an electrical signal path extended from the electrode, for example. The width of each of the groove segments forming the first pattern is preferably, but not limited to being, equal to the width of each of the groove segments forming the second pattern. The doctor blade moves from the first pattern toward the second pattern on the gravure plate.

The present invention relates, in another aspect, to a wiring board including a base and a wiring structure on the base. The wiring structure includes a conductive network formed of a conductor. The conductive network has a wiring pattern. The conductive network is positioned, directly or indirectly, on the base. More specifically, the conductive network may be positioned on the base, or on an insulation layer included in the wiring structure. The conductor forming the conductive network is cured conductive ink. The conductive network includes a number of conductive line segments, and at least one site Q where N conductive line segments converge, in other words, meet or diverge. N is an integer satisfying N 3. Each of the conductive line segments preferably has a straight shape, but may have, for example, a curved shape, a bent shape or a meander shape. Any one of the conductive line segments, except both ends thereof, neither intersects with nor makes contact with the other conductive line segments. Readers may understand the site Q by reference to a site indicated by a reference numeral a1 in FIG. 5A. The site Q is, in short, an intersection, or an at-grade junction, of N conductive line segments. A virtual line on the wiring board, which passes through any of the one or more intersections Q and extends in a direction orthogonal to a travel direction of the doctor blade used during gravure printing, intersects one or more conductive line segments, except both ends thereof, that are included in the conductor network. The travel direction of the doctor blade is reasonably estimated by those skilled in the art from the shape of the board or the wiring pattern. When the shape of the board is rectangular, the direction parallel to the long side or the short side of the board may be estimated to be the travel direction of the doctor blade. Alternatively, an extension direction of a straight line L, which in the wiring pattern gives the smallest total number of conductive line segments parallel to the straight line L, may be estimated to be the travel direction of the doctor blade. At least one of the one or more conductive line segments which intersect with the virtual line has a width that is 1.5 times or more the minimum width of the conductive line segments included in the conductive network. Each conductive line segment is preferably a thin, or fine, conductive line segment that has a width of several micrometers or several tens of micrometers.

The wiring pattern of the conductive network preferably includes a first wiring pattern, a second wiring pattern, and a transition pattern that is located between the first wiring pattern and the second wiring pattern and connects the first wiring pattern and the second wiring pattern. The transition pattern is formed of part of the conductive network and this part includes preferably conductive line segments which extend from some but not all of the conductive line segments forming the first wiring pattern, and conductive line segments which extend from some but not all of the conductive line segments forming the second wiring pattern. The intersection Q is included in this part of the conductor network. In this regard, note that $d_2 > d_t > d_1$ is satisfied when "pattern density" is defined as "the area of the conductive line segments per unit area of the wiring board", "the area of the conductive line segments" included herein is defined as "the total area of the conductive line segments as observed in a plan view of the wiring board", the pattern density of the first wiring pattern is $d_1$, the pattern density of the second wiring pattern is $d_2$, and the pattern density of the transition pattern is $d_t$. The first wiring pattern preferably has a mesh pattern. The mesh pattern of the first wiring pattern has parallelogram apertures, preferably rhombus apertures. The second wiring pattern preferably has a mesh pattern. The mesh pattern of the second wiring pattern has parallelogram apertures, preferably rhombus apertures. The sizes, more specifically areas, of the apertures included in the first wiring pattern are bigger than the sizes, more specifically areas, of the apertures included in the second wiring pattern. The first wiring pattern is a pattern for an electrode of the transducer, for example. The second wiring pattern is a pattern for an electrical signal path extended from the electrode, for example. The line width of each of the conductive line segments forming the first wiring pattern is preferably, but not limited to being, equal to the line width of each of the conductive line segments forming the second wiring pattern.

The present invention relates, in yet another aspect, to the gravure plate described supra.

Effects of the Invention

The wiring board production method according to the present invention makes it possible to prevent faint print from occurring on fine wires during gravure printing of wires including a fine-wire pattern, thereby preventing an increase in resistance and breakage of the fine wires due to faint print.

Further, the wiring board according to the present invention has a fine-wire pattern formed by gravure printing in which squeegeeing is performed in a specified direction on the wiring board and therefore has excellent print quality without faint print on the fine wires.

BRIEF DESCRIPTION OF THE DRAWINGS

FIG. 7 is a diagram for explaining a modification of the embodiment shown in FIG. 6.

REFERENCE SIGNS LIST

Figure 1:
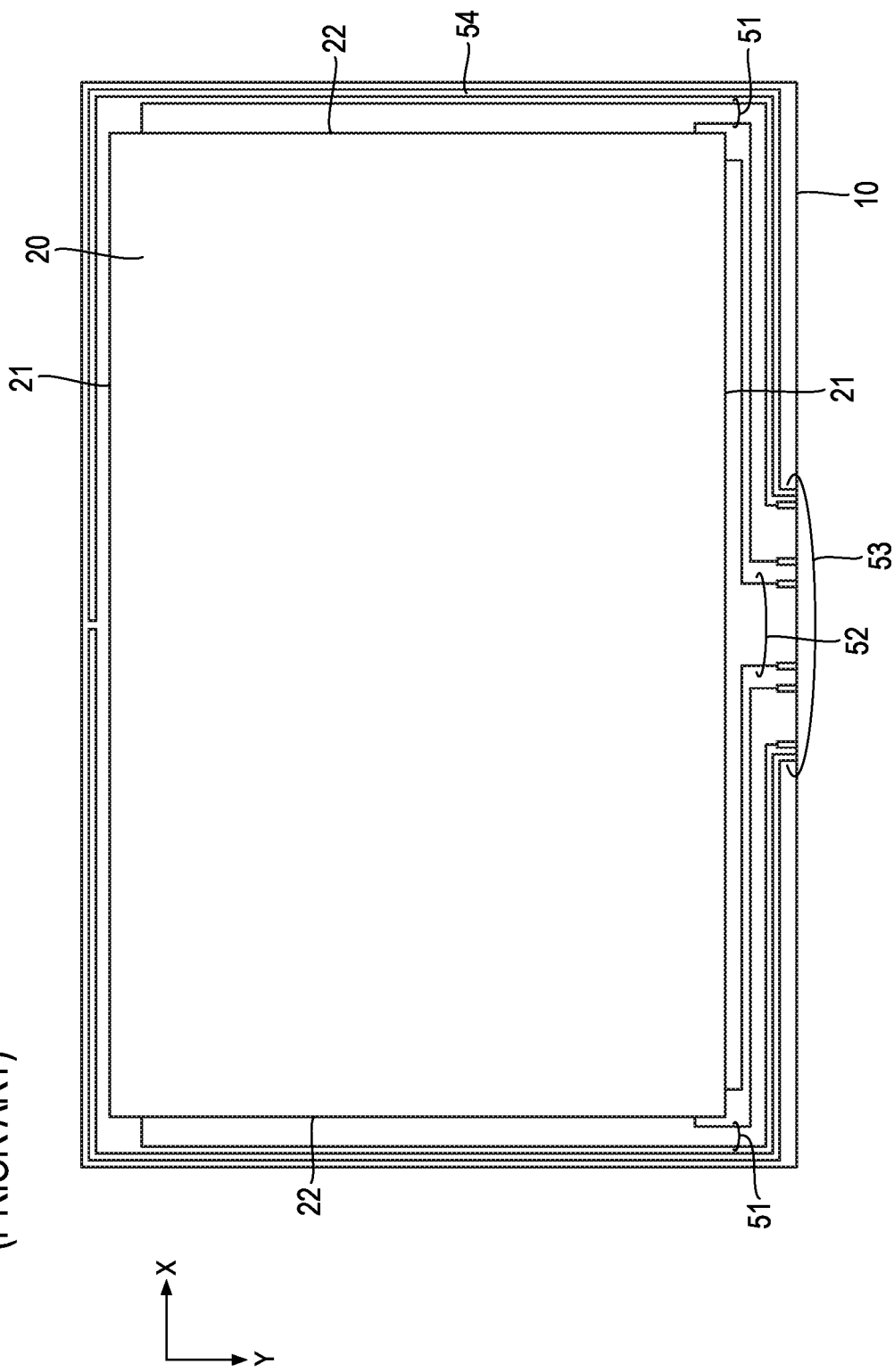
FIG. 1 is a diagram showing the outline of the configuration of a touch panel as an example of a conventional component of a wiring board.
Figure 2A:
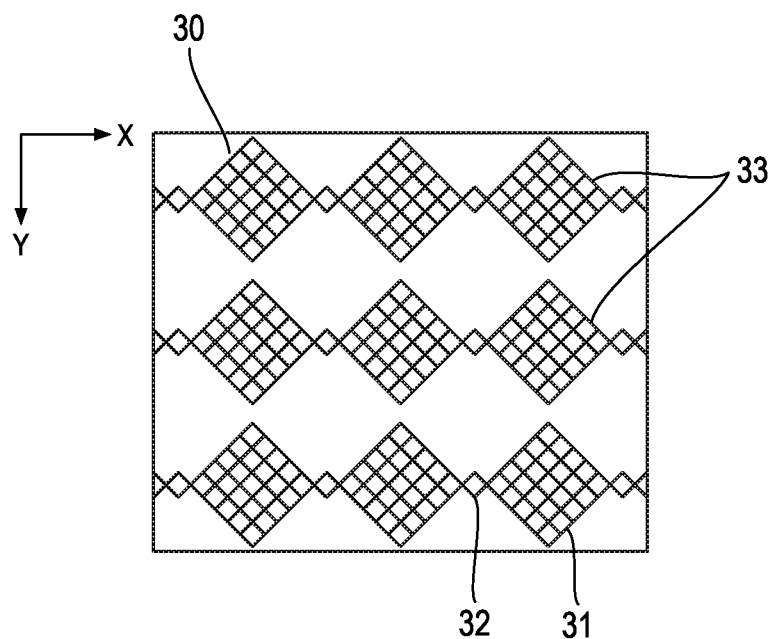
FIG. 2A is a partially enlarged view showing a first sensor electrode of the touch panel shown in FIG. 1.
Figure 2B:
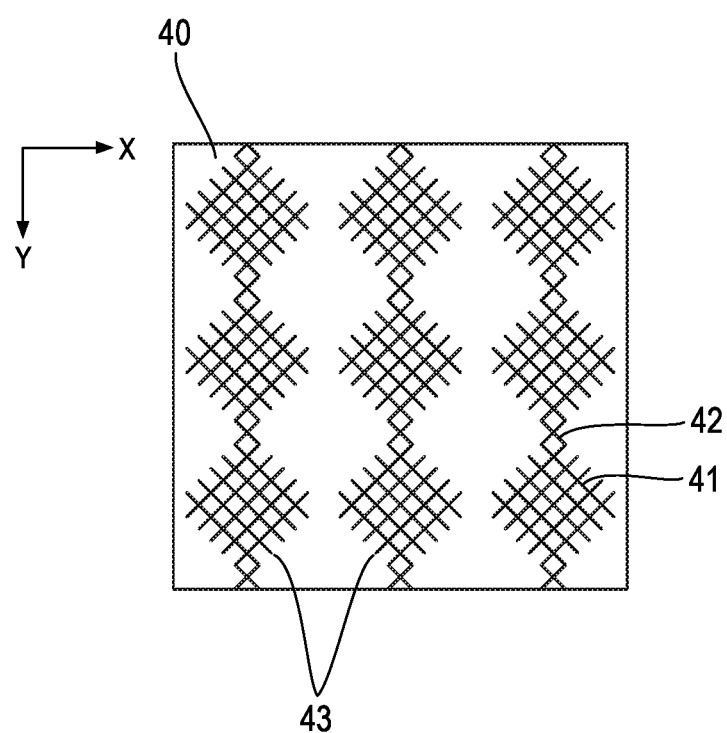
FIG. 2B is a partially enlarged view showing a second sensor electrode of the touch panel shown in FIG. 1.
Figure 3:
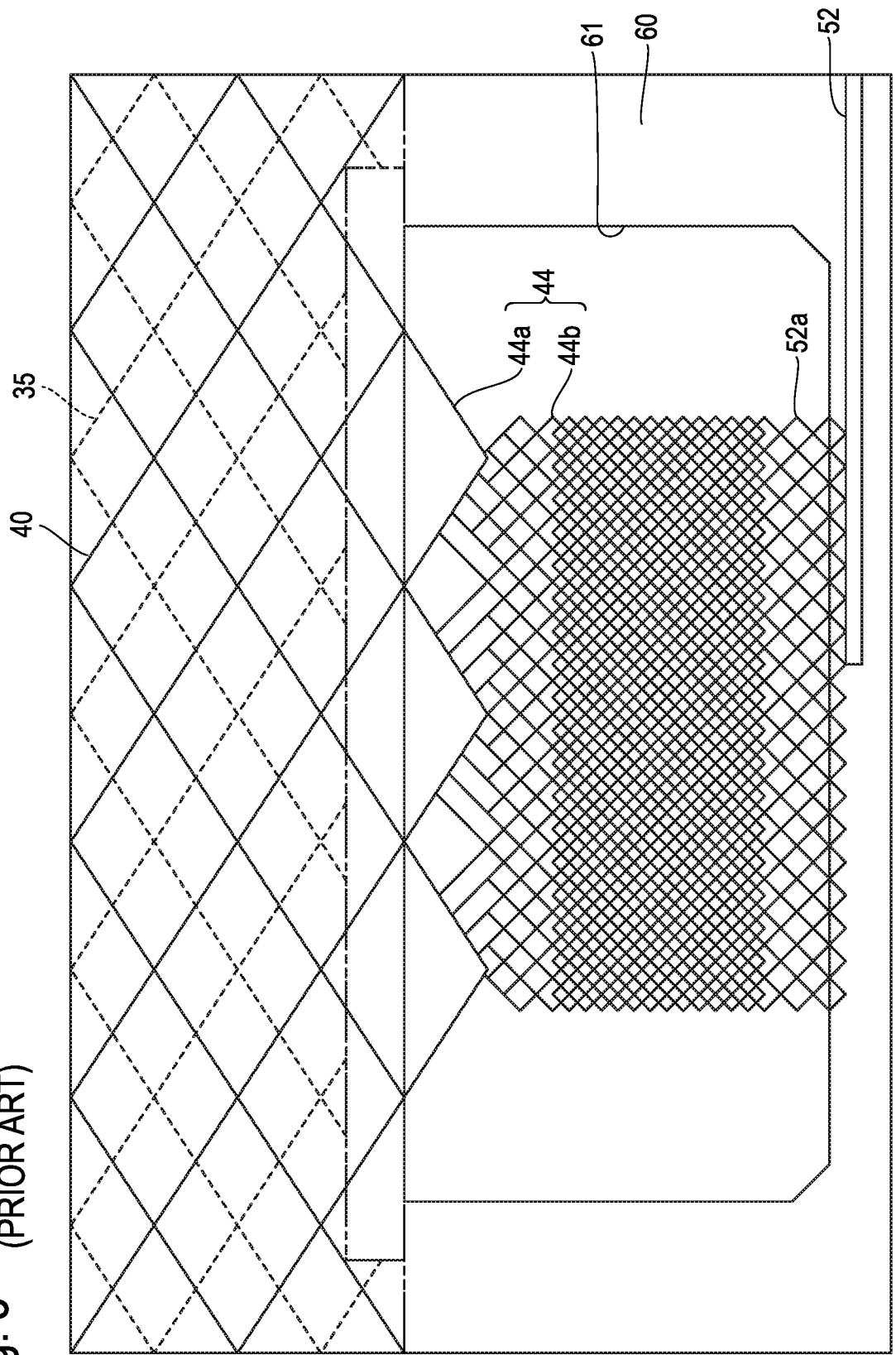
FIG. 3 is a partially enlarged view of a portion of the touch panel shown in FIG. 1 in which the second sensor electrode and a lead wire are connected.

10 Transparent board
20 Sensor area
21 Long side
22 Short side
30 First sensor electrode
31 Island-like electrode
32 Connection part
33 Electrode row
35 Dummy wire
40 Second sensor electrode
41 Island-like electrode
42 Connection part
43 Electrode row
44 Extension portion
44a Large mesh portion
44b Small mesh portion
51, 52 Lead wire
52a Connection part
53 Terminal portion
54 Grounding wire
60 Insulating layer
61 Through hole
70 Second sensor electrode
71 Extension portion
72-76, 73'-76' Fine wire

DETAILED DESCRIPTION OF THE EMBODIMENTS

First, faint print that occurs on fine wires when a fine-wire pattern is printed by gravure printing or gravure offset printing will be described.

Figure 4:
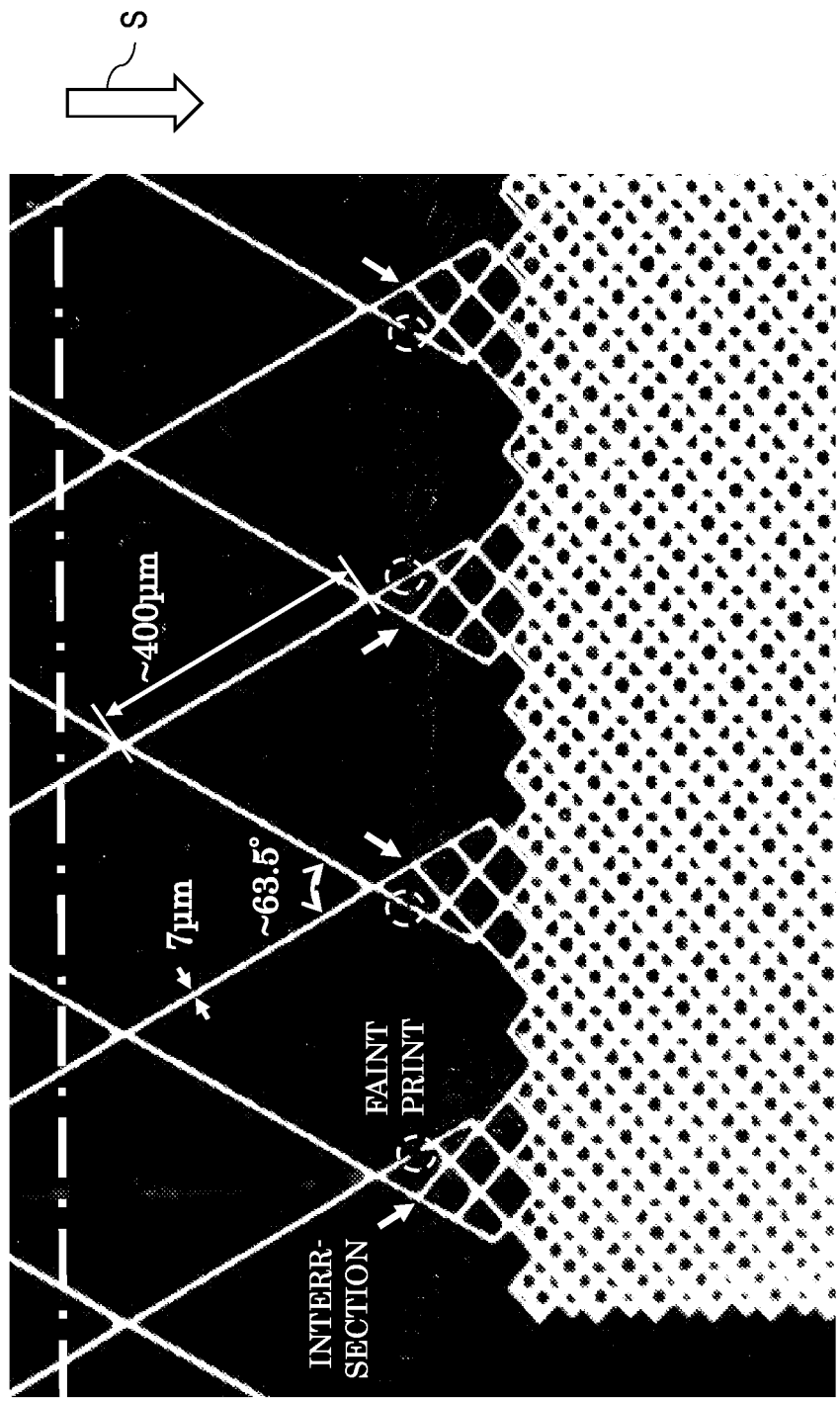
FIG. 4 is a photograph showing faint print that occurred on fine wires.
Figure 5A:
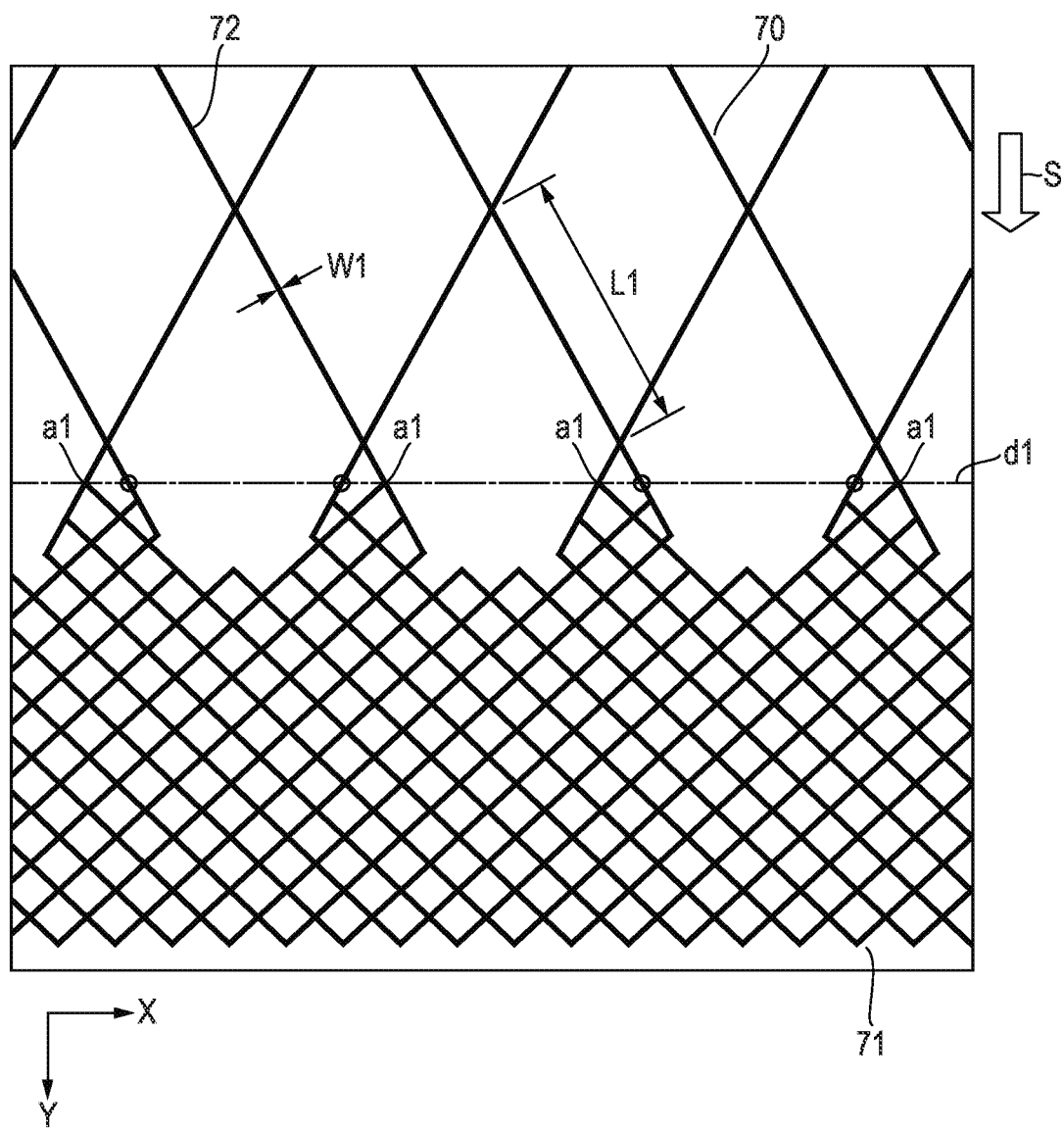
FIG. 5A is a diagram for explaining faint print that occurs on fine wires.
Figure 5B:
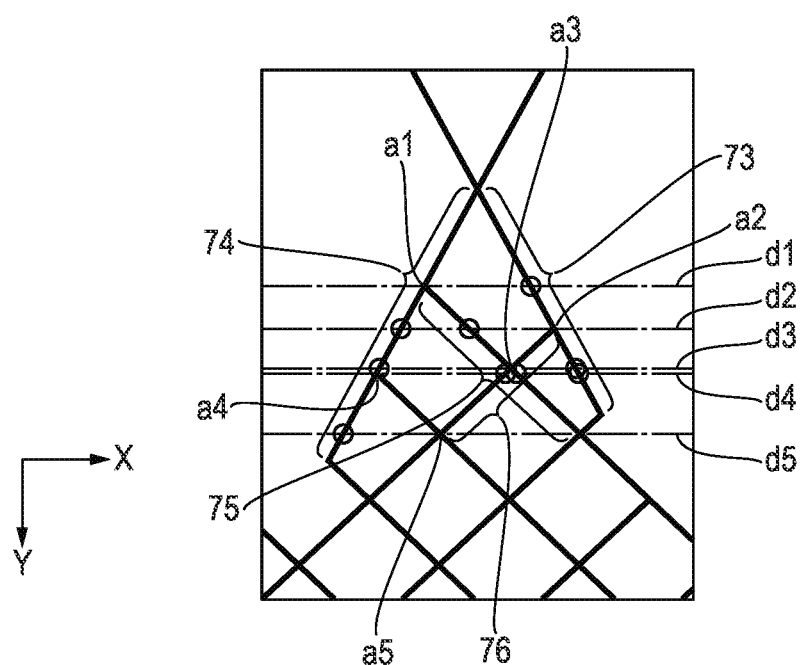
FIG. 5B is a partially enlarged view of FIG. 5A.

FIG. 5A shows the original state (without faint print) of a fine-wire pattern consisting of the second sensor electrode 70 in the photograph shown in FIG. 4 and the extension portion 71 formed on the end edge of the second sensor electrode 70, and FIG. 5B is an enlarged view of a part of FIG. 5A.

The line width W1 of the fine wire 72 of the fine-wire pattern, which is also shown in FIG. 4, is 7 μm at any point. As shown in FIG. 4, the length L1 of one side of each rhombus unit lattice cell of the mesh of the second sensor electrode 70 is 400 μm. As shown in FIG. 5A, two orthogonal directions are defined assuming that the squeegeeing direction (arrow S) of the doctor blade is the direction Y and the extension direction of the doctor blade is the direction X.

In FIG. 5A, the circled spots are where faint print enclosed by the dotted circles as shown in FIG. 4 are remarkable. The intersections a1 correspond to the intersections pointed by the arrows in FIG. 4, and the alternate long and short dashed line d1 is a line drawn parallel to the direction X through the intersections a1.

It is clear, from the intersections a1, the alternate long and short dashed line d1, and the circled spots where faint print occurred, that when viewed from the intersections a1, faint print occurred on the fine wires that pass through points aligned in the direction (direction X) that coincides with the extension direction of the doctor blade during the squeegeeing by the doctor blade and do not intersect at these points.

Such faint print appears as the phenomenon that, assuming that intersections on the gravure plate corresponding to the intersections a1 are a1', when the doctor blade passes through the intersections a1' during the squeegeeing step, the doctor blade slightly drops in the grooves for the intersections a1', and when the doctor blade passes through the intersections a1', that is, during the slight drop, the doctor blade enters deeper than usual into the grooves for other nearby fine wires that the doctor blade passes through as well at the time, so that the conductive ink supposed to be charged in the grooves for the other nearby fine wires is scraped out from the grooves, and the spots cannot be filled with an appropriate amount of ink.

The line width in the direction X of the grooves for the intersections a1' where the grooves for the fine wires are centered is larger (wider) than the line width in the direction X of the grooves for each single fine wire, and portions with such a wide line width are formed with a limited length in the direction Y. In these portions, the doctor blade is induced to drop, but the wide width allows a large amount of ink to be charged, thereby avoiding faint print. In contrast, faint print occurs in grooves having a narrow line width that is affected by the drop of the doctor blade, that is, grooves for single fine wires that do not intersect any other wires.

For this reason, in the present invention, the line width of the grooves for the fine wires where such faint print occurs is designed and formed to be wider than usual. Thus, an amount of ink enough to avoid faint print can be charged even in case of scraping by the doctor blade.

Based on this idea, in the wiring board production method including a fine-wire pattern formed by gravure printing using conductive ink, assuming that the two orthogonal directions on the plate surface of the gravure plate having grooves for the fine-wire pattern are the directions X and Y, on the gravure plate, for one intersection where the grooves for fine wires included in a fine-wire pattern are centered at one spot, the line width of the groove for a fine wire that is included in the fine-wire pattern, passes through another point on the plate surface not aligned with the intersection in the direction X but in the direction Y, and does not form the other intersection where the grooves for fine wires are centered at one spot at the other point is 1.5 times or more the minimum line width of the grooves for the fine wires included in the fine-wire pattern; thus, the grooves for the fine-wire pattern are filled with conductive ink by squeegeeing by moving the doctor blade set in the direction X with respect to the plate surface (extending in the direction X) in the direction Y.

In the wiring board produced in this way and having a fine-wire pattern of a cured conductive ink formed on a plate surface, assuming that the two orthogonal directions on the plate surface are the directions X and Y, for one intersection where the fine wires included in the fine-wire pattern are centered at one spot, the line width of another fine wire that is included in the fine-wire pattern, passes through another point on the plate surface not aligned with the intersection in the direction X but aligned in the direction Y, and does not form the other intersection where fine wires are centered at one spot at the other point is 1.5 times or more the minimum line width of the fine wires included in the fine-wire pattern. In other words, especially when the wiring board includes fine wires having a line width of 10 μm or less, or when the conductive ink contains conductive particles having a particle size of 0.5 μm or more, the wiring board cannot be produced by printing unless gravure printing is adopted. With a wiring board having such a configuration, a product can be produced achieving the purpose by gravure printing involving a squeegeeing step in which a doctor blade set in the direction X is moved in the direction Y.

Here, an intersection where fine wires are centered at one spot refers to an intersection where three or more fine wires are centered at one spot, a Y-shaped intersection is an intersection where three fine wires are centered, and an X-shaped intersection is an intersection where four fine wires are centered. In addition, a fine wire that does not form an intersection at the other point may be two fine wires centered from different directions to form a bending point at the other point.

FIG. 5B is an enlarged view of a part of FIG. 5A. Referring to FIG. 5B, alternate long and short dashed lines d2 to d5 are added to the alternate long and short dashed line d1. These alternate long and short dashed lines d2 to d5 are lines drawn parallel to the direction X through intersections a2 to a5, respectively, corresponding to intersections where the above-mentioned three or more fine wires are centered at one spot. The drawing shows that on these alternate long and short dashed lines d2 to d5, single fine wires (fine wires that do not form intersections) intersect respectively. Thus, besides the circled spots on the alternate long and short dashed line d1, the circled spots in FIG. 5B are spots where faint print may occur, and the line width of the fine wires 73 to 76 which include these spots are therefore widened. In other words, the line width of the grooves for the fine wires on the gravure plate corresponding to the fine wires 73 to 76 are widened.

Figure 6:
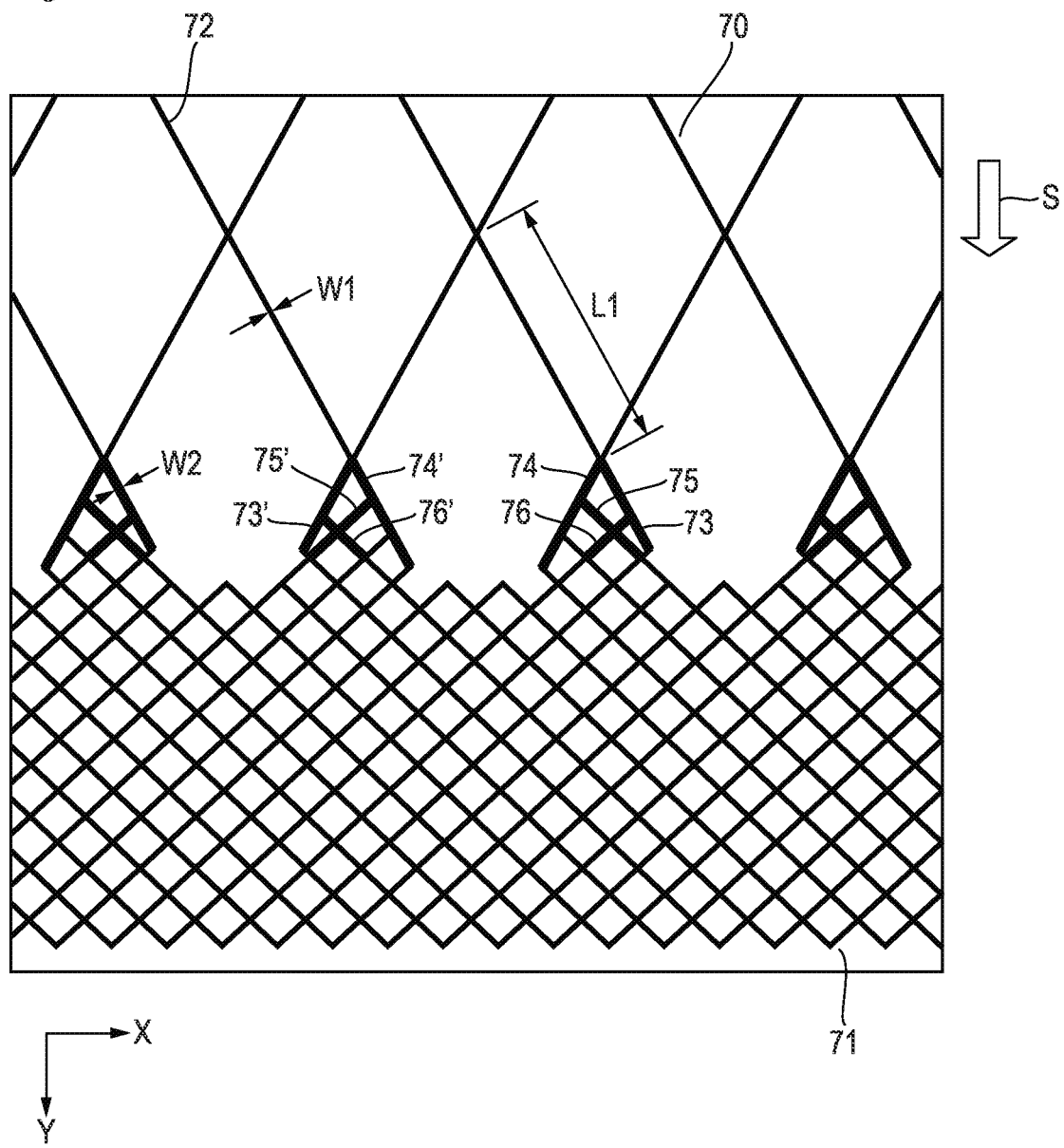
FIG. 6 is a diagram for explaining an embodiment of a wiring board according to the present invention.

FIG. 6 shows a wiring pattern in which the line widths of the fine wires 73 to 76 shown in FIG. 5B and the fine wires 73' to 76' which are symmetrically located are widened in contrast to FIG. 5A. The parts corresponding to those in FIG. 5A are represented by the same reference numerals as in FIG. 5A.

The line width W2 of the fine wires 73 to 76 and 73' to 76' is 15 μm, which is 1.5 times or more the minimum line width of the fine wires included in the fine-wire pattern (W1=7 μm in this example) in this example.

Widening the line width of the fine wires 73 to 76 and 73' to 76' in this way makes it possible to prevent the occurrence of faint print and an increase in resistance and breakage of fine wires due to faint print.

It should be noted that, for example, as in the extension portion 71 with a periodic structure of a fine wire mesh in which single fine wires do not intersect on a line parallel to the direction X passing through one fine wire intersection, and only intersections of fine wires exist, the present invention is not applicable.

In order to prevent faint print, the line width of the fine wires to be thickened (widened) is 1.5 times or more and preferably three times at most, i.e., three times or less the minimum line width of the fine wires included in the fine-wire pattern. An objective of this is to concurrently gravure-offset print fine wires that are relatively excessively thick compared to the remaining fine wires to cause swelling to locally accelerate at sites to receive ink for fine wires with a thick blanket, thereby preventing the ink quality from locally deteriorating at the site.

Considering the effect of the drop of the doctor blade, when viewed from an intersection where the grooves for three or more fine wires are centered at one spot on a gravure plate, if there are more than one grooves for fine wires that pass through points aligned in the extension direction (direction X) of the doctor blade and do not form any intersections at the points, not all the line widths of the grooves for all the fine wires have to be widened. In other words, it is unnecessary to even widen the line widths of the grooves for the fine wires located in positions where they are insusceptible to the drop of the doctor blade at the intersections, and at least the line widths of the grooves for the fine wires located within 200 µm from the respective intersections with respect to the direction X should be widened.

It is preferable that when there are more than one grooves for fine wires that pass through points aligned in the extension direction (direction X) of the doctor blade and do not form any intersections at the points when viewed from an intersection where grooves for fine wires are centered at one spot, the line width of the groove for the fine wire closest from the intersection in the direction X be widened.

A gravure plate used for gravure printing may be in a form of a flat plate or roll. In the case of a roll gravure plate, the two orthogonal directions: the directions X and Y on the plate surface are defined assuming that the direction Y as the rotation direction belongs to a plane spatially orthogonal to the direction X.

In the case of a wiring board having a square outer shape such as the touch panel shown in FIG. 1, squeegeeing by the doctor blade is generally performed in a direction parallel to any side of the square. For this reason, the wiring board of the present invention has a square outer shape in which two sets of two parallel and opposite sides are parallel to the directions X and Y, respectively.

FIG. 7 shows a modification of the embodiment of the present invention shown in FIG. 6. In this example, the line widths of the fine wires 75 and 76 and 75' and 76' are not widened, but only the line widths of the fine wires 73 and 74 and 73' and 74' are widened. The reasons for adopting such a configuration are:

1) In each V-shaped region where the fine wires 73 to 76 and 73' to 76' are located, even if the fine wires 75 and 76 and 75' and 76' inside the V-shape are faint, sufficient electrical connection performance is ensured when the line widths of the fine wires 73 and 74 and 73' and 74' which form a V-shaped outer shape are widened.

2) To avoid local deterioration of print quality due to the local progress of swelling of the blanket due to the high density of fine lines with widened line widths. Depending on the configuration and function of the fine-wire pattern, a configuration in which the line widths of some (internal) fine wires are not widened in this manner may be adopted.

As a matter of course, this specification discloses a gravure plate and the gravure plate of the embodiment has features that are obvious from the description above. The gravure plate of the embodiment will now be described again from another viewpoint.

The gravure plate has a reticular groove for storing the conductive ink. The pattern of the reticular groove coincides with the wiring pattern. The reticular groove includes a number of groove segments, and at least one site P where N groove segments converge, in other words, meet or diverge. N is an integer satisfying N≥3. Each of the groove segments preferably has a straight shape, but may have, for example, a curved shape, a bent shape or a meander shape. Any one of the groove segments, except both ends thereof, neither intersects with nor makes contact with the other groove segments. The site P is, in short, an intersection, or an at-grade junction, of N groove segments. A virtual line on the gravure plate, which passes through any of the one or more intersections P and extends in a direction orthogonal to a travel direction of the doctor blade used during gravure printing, intersects one or more groove segments, except both ends thereof, that are included in the reticular groove of the gravure plate. The travel direction of the doctor blade is reasonably estimated by those skilled in the art from the shape of the gravure plate or the pattern of the reticular groove. When the shape of the gravure plate is rectangular, the direction parallel to the long side or the short side of the gravure plate may be estimated to be the travel direction of the doctor blade. When the shape of the gravure plate is a cylinder, the circumferential direction along the surface of the cylinder may be estimated to be the travel direction of the doctor blade. Alternatively, an extension direction of a straight line L, which in the pattern of the reticular groove gives the smallest total number of the groove segments parallel to the straight line L, may be estimated to be the travel direction of the doctor blade. At least one of the one or more groove segments which intersect with the virtual line has a width that is 1.5 times or more the minimum width of the groove segments included in the reticular groove. Each groove segment is preferably a thin, or fine, groove segment that has a width of several micrometers or several tens of micrometers. The pattern of the reticular groove preferably includes a first pattern, a second pattern, and a transition pattern that is located between the first pattern and the second pattern and connects the first pattern and the second pattern. The transition pattern is formed of part of the reticular groove and this part includes preferably groove segments which extend from some but not all of the groove segments forming the first pattern, and groove segments which extend from some but not all of the groove segments forming the second pattern. The intersection P is included in this part of the reticular groove. In this regard, note that $D_2 > D_t > D_1$ is satisfied when "pattern density" is defined as "the area of the groove segments per unit area of the gravure plate", "the area of the groove segments" included herein is defined as "the total area of the bottoms of the groove segments as observed in a plan view of the gravure plate", the pattern density of the first pattern is $D_1$, the pattern density of the second pattern is $D_2$, and the pattern density of the transition pattern is $D_t$. The first pattern preferably has a mesh pattern. The mesh pattern of the first pattern has parallelogram apertures, preferably rhombus apertures. The second pattern preferably has a mesh pattern. The mesh pattern of the second pattern has parallelogram apertures, preferably rhombus apertures. The sizes, more specifically areas, of the apertures included in the first pattern are bigger than the sizes, more specifically areas, of the apertures included in the second pattern. The first pattern is, for example, a pattern for an electrode which is, but not limited to, the electrode designated by the reference numeral 70 in the description above. The second pattern is, for example, a pattern for an electrical signal path which is extended from the electrode and which is, but not limited to, the electrical signal path designated by the reference numeral 71 in the description above. The width of each of the groove segments forming the first pattern is preferably, but not limited to being, equal to the width of each of the groove segments forming the second pattern. The numerical conditions related to the groove segments in the embodiment are as described above. The doctor blade moves from the first pattern toward the second pattern on the gravure plate.

What is claimed is:

1. A wiring board comprising:
a base having a base surface; and
a pattern of fine-wire formed in a cured conductive ink provided on the base surface, the pattern of fine-wire comprising an intersection of wires and a non-crossing point of wire which are located in different two positions in an X direction and in an identical position in a Y direction, wherein the X direction and the Y direction are defined as two mutually orthogonal directions in the board surface, the intersection of wires having three or more wires converged therein, the non-crossing point of wire not forming another intersection of wires which has other three or more wires converged therein, wherein a wire width of the non-crossing point of wire is 1.5 times or more a minimum wire width of the pattern of fine-wire.

2. The wiring board according to claim 1, wherein the wire width of the non-crossing point of wire is 3 times or less the minimum wire width of the pattern of fine-wire.

3. The wiring board according to claim 1, wherein a distance between the intersection of grooves and the non-crossing point of groove in the X direction is 200 µm or less.

4. The wiring board according to claim 2, wherein a distance between the intersection of grooves and the non-crossing point of groove in the X direction is 200 µm or less.

5. The wiring board according to claim 1, wherein the pattern of fine-wire comprises a plurality of non-crossing points of wire each of which is located in a position different in the X direction than and identical in the Y direction to a position of said intersection of wires, none of the plurality of non-crossing points of wire forming another intersection of wires which has other three or more wires converged therein, and said non-crossing point of wire is one of the plurality of non-crossing points of wire that is closest thereamong from said intersection of wires in the X direction.

6. The wiring board according to claim 2, wherein the pattern of fine-wire comprises a plurality of non-crossing points of wire each of which is located in a position different in the X direction than and identical in the Y direction to a position of said intersection of wires, none of the plurality of non-crossing points of wire forming another intersection of wires which has other three or more wires converged therein, and said non-crossing point of wire is one of the plurality of non-crossing points of wire that is closest thereamong from said intersection of wires in the X direction.

7. The wiring board according to claim 3, wherein the pattern of fine-wire comprises a plurality of non-crossing points of wire each of which is located in a position different in the X direction than and identical in the Y direction to a position of said intersection of wires, none of the plurality of non-crossing points of wire forming another intersection of wires which has other three or more wires converged therein, and said non-crossing point of wire is one of the plurality of non-crossing points of wire that is closest thereamong from said intersection of wires in the X direction.

8. The wiring board according to claim 4, wherein the pattern of fine-wire comprises a plurality of non-crossing points of wire each of which is located in a position different in the X direction than and identical in the Y direction to a position of said intersection of wires, none of the plurality of non-crossing points of wire forming another intersection of wires which has other three or more wires converged therein, and said non-crossing point of wire is one of the plurality of non-crossing points of wire that is closest thereamong from said intersection of wires in the X direction.

9. The wiring board according to claim 1, wherein the wiring board has a square outer shape which has two pairs of mutually parallel and opposite sides, one of the two pairs being parallel to the X direction and an other of the two pairs being parallel to the Y directions, respectively.

10. The wiring board according to claim 2, wherein the wiring board has a square outer shape which has two pairs of mutually parallel and opposite sides, one of the two pairs being parallel to the X direction and an other of the two pairs being parallel to the Y directions, respectively.

11. The wiring board according to claim 3, wherein the wiring board has a square outer shape which has two pairs of mutually parallel and opposite sides, one of the two pairs being parallel to the X direction and an other of the two pairs being parallel to the Y directions, respectively.

12. The wiring board according to claim 4, wherein the wiring board has a square outer shape which has two pairs of mutually parallel and opposite sides, one of the two pairs being parallel to the X direction and an other of the two pairs being parallel to the Y directions, respectively.

13. The wiring board according to claim 5, wherein the wiring board has a square outer shape which has two pairs of mutually parallel and opposite sides, one of the two pairs being parallel to the X direction and an other of the two pairs being parallel to the Y directions, respectively.

14. The wiring board according to claim 6, wherein the wiring board has a square outer shape which has two pairs of mutually parallel and opposite sides, one of the two pairs being parallel to the X direction and an other of the two pairs being parallel to the Y directions, respectively.

15. The wiring board according to claim 7, wherein the wiring board has a square outer shape which has two pairs of mutually parallel and opposite sides, one of the two pairs being parallel to the X direction and an other of the two pairs being parallel to the Y directions, respectively.

16. The wiring board according to claim 8, wherein the wiring board has a square outer shape which has two pairs of mutually parallel and opposite sides, one of the two pairs being parallel to the X direction and an other of the two pairs being parallel to the Y directions, respectively.

* * * * *

UNITED STATES PATENT AND TRADEMARK OFFICE
CERTIFICATE OF CORRECTION

PATENT NO. : 11,711,895 B2
APPLICATION NO. : 17/538410
DATED : July 25, 2023
INVENTOR(S) : Akitoshi Sakaue et al.

It is certified that error appears in the above-identified patent and that said Letters Patent is hereby corrected as shown below:

In the Specification

Column 3, Line 28, please change "satisfying N 3. Each of" to -- satisfying $N \geq 3$. Each of --.

Column 4, Line 32, please change "integer satisfying N 3. Each of" to -- integer satisfying $N \geq 3$. Each of --.

Signed and Sealed this
Seventh Day of November, 2023

Katherine Kelly Vidal
*Director of the United States Patent and Trademark Office*